United States Patent
Wang et al.

(10) Patent No.: US 11,335,283 B2
(45) Date of Patent: May 17, 2022

(54) DISPLAY DEVICE AND DISPLAY METHOD THEREOF, DISPLAY EQUIPMENT

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Chenru Wang, Beijing (CN); Yali Liu, Beijing (CN); Hao Zhang, Beijing (CN); Lili Chen, Beijing (CN); Ruijun Dong, Beijing (CN); Xuebing Zhang, Beijing (CN); Ke Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 325 days.

(21) Appl. No.: 16/483,541

(22) PCT Filed: Oct. 25, 2018

(86) PCT No.: PCT/CN2018/111923
§ 371 (c)(1),
(2) Date: Aug. 5, 2019

(87) PCT Pub. No.: WO2019/184324
PCT Pub. Date: Oct. 3, 2019

(65) Prior Publication Data
US 2021/0335294 A1 Oct. 28, 2021

(30) Foreign Application Priority Data

Mar. 28, 2018 (CN) .......................... 201810264274.X

(51) Int. Cl.
*G09G 3/34* (2006.01)
*G09G 3/36* (2006.01)
(Continued)

(52) U.S. Cl.
CPC ..... *G09G 3/3607* (2013.01); *G02F 1/133526* (2013.01); *G02F 1/134309* (2013.01);
(Continued)

(58) Field of Classification Search
CPC .......................................... G09G 3/3433–3473
See application file for complete search history.

(56) References Cited

U.S. PATENT DOCUMENTS 9,874,763 B2 * 1/2018 Lu .................. G09G 3/3607
2016/0307482 A1 * 10/2016 Huang ................ G09G 3/002
(Continued)

FOREIGN PATENT DOCUMENTS

CN  103943071 A  7/2014
CN  104865750 A  8/2015
(Continued)

*Primary Examiner* — Roy P Rabindranath
(74) *Attorney, Agent, or Firm* — Dilworth & Barrese, LLP.; Michael J. Musella, Esq.

(57) ABSTRACT

A display device and a display method thereof, and a display equipment are disclosed. The display device includes a display panel and a light transmittance adjusting layer, the display panel includes a plurality of pixel regions, the light transmittance adjusting layer is stacked with the display panel, and the light transmittance adjusting layer is configured to adjust display brightness of the plurality of pixel regions.

16 Claims, 6 Drawing Sheets

(51) Int. Cl.
*G02F 1/1335* (2006.01)
*G02F 1/1343* (2006.01)
*G02F 1/155* (2006.01)

(52) U.S. Cl.
CPC .......... *G02F 1/155* (2013.01); *G02F 2201/44* (2013.01); *G09G 2320/066* (2013.01); *G09G 2320/0626* (2013.01)

(56) References Cited

U.S. PATENT DOCUMENTS

| | | | |
|---|---|---|---|
| 2017/0192223 A1 | 7/2017 | Jiang et al. | |
| 2017/0343839 A1* | 11/2017 | Nam | G09G 3/3688 |
| 2018/0024628 A1* | 1/2018 | Kim | G02B 27/01 |
| | | | 345/156 |
| 2019/0066605 A1 | 2/2019 | Shao et al. | |
| 2019/0080664 A1* | 3/2019 | Li | G09G 3/3433 |

FOREIGN PATENT DOCUMENTS

| | | |
|---|---|---|
| CN | 105700243 A | 6/2016 |
| CN | 106952621 A | 7/2017 |
| CN | 107077000 A | 8/2017 |
| KR | 20080021958 A | 3/2008 |

\* cited by examiner

DISPLAY DEVICE AND DISPLAY METHOD THEREOF, DISPLAY EQUIPMENT

The application claims priority to Chinese patent application No. 201810264274.X, filed on Mar. 28, 2018, the entire disclosure of which is incorporated herein by reference as part of the present application.

TECHNICAL FIELD

Embodiments of the present disclosure relate to a display device and a display method thereof, and a display equipment.

BACKGROUND

With development of the society, the application of electronic display products is increasing, and users have increasingly high requirements for the display effect of electronic display products. The contrast is one of the important parameters for measuring the effect of the display image of the electronic display product, and a high-contrast display image can give the user a better visual experience. However, current electronic display products are limited by the design of their own structures, the gray level of the display image is usually fixed, and the gray level is low, thereby making it difficult for the electronic display product to display a display image with higher contrast.

SUMMARY

At least one embodiment of the present disclosure provides a display device, which comprises: a display panel, comprising a plurality of pixel regions; and a light transmittance adjusting layer stacked with the display panel. The light transmittance adjusting layer is configured to adjust display brightness of the plurality of pixel regions.

For example, in the display device provided by at least one embodiment of the present disclosure, the light transmittance adjusting layer is on a light-emitting side of the display panel.

For example, the display device provided by at least one embodiment of the present disclosure further comprises: a backlight module on a light-entering side of the display panel. The light transmittance adjusting layer is between the backlight module and the display panel.

For example, in the display device provided by at least one embodiment of the present disclosure, the light transmittance adjusting layer comprises a plurality of light adjusting units arranged in an array, each of the plurality of pixel regions is disposed corresponding to at least one of the plurality of light adjusting units, and the light adjusting unit is switchable to be in different light transmittances in operation.

For example, in the display device provided by at least one embodiment of the present disclosure, the pixel region comprises at least one pixel unit; and the light adjusting unit is disposed in one-to-one correspondence with the pixel region, or, the light adjusting unit is disposed in one-to-one correspondence with the pixel unit.

For example, in the display device provided by at least one embodiment of the present disclosure, the light adjusting unit comprises: a light attenuating film, comprising a plurality of light adjusting regions of different light transmittances; and a micro-electro-mechanical driving unit configured to drive the light attenuating film to move, so as to allow the light adjusting region to be stacked with the display panel.

For example, in the display device provided by at least one embodiment of the present disclosure, the micro-electro-mechanical driving unit comprises a first rotating shaft and a second rotating shaft, the light attenuating film is wound around the first rotating shaft and the second rotating shaft, and the first rotating shaft and the second rotating shaft are rotated to allow one of the plurality of light adjusting regions to spread into a plane.

For example, in the display device provided by at least one embodiment of the present disclosure, the first rotating shaft and the second rotating shaft are both electrostatic micro-motors; and the electrostatic micro-motor comprises a rotor and a stator which are spaced apart from each other, and the rotor is rotatable relative to the stator under driving of a voltage.

For example, in the display device provided by at least one embodiment of the present disclosure, an orthographic projection of the pixel region on the display panel coincides with an orthographic projection of the light adjusting region on the display panel, alternatively, the orthographic projection of the pixel region on the display panel is within the orthographic projection of the light adjusting region on the display panel.

For example, in the display device provided by at least one embodiment of the present disclosure, the light adjusting unit comprises: a first electrode, a second electrode, and a light adjusting layer. The first electrode and the second electrode are applied with voltages to adjust a light transmittance of the light adjusting layer.

For example, in the display device provided by at least one embodiment of the present disclosure, the light adjusting layer comprises a liquid crystal layer, and a first polarizing layer and a second polarizing layer respectively on two sides of the liquid crystal layer; and the first electrode and the second electrode are on a same side or different sides of the liquid crystal layer, and the first electrode and the second electrode are applied with the voltages to adjust the light transmittance of the light adjusting layer.

For example, in the display device provided by at least one embodiment of the present disclosure, the light adjusting layer is an electrochromic layer, the electrochromic layer is between the first electrode and the second electrode, and the first electrode, the electrochromic layer and the second electrode are sequentially stacked in a direction perpendicular to a plane on which the display panel is located.

For example, in the display device provided by at least one embodiment of the present disclosure, the light adjusting layer is an electronic ink layer, the electronic ink layer is between the first electrode and the second electrode, and the first electrode, the electronic ink layer and the second electrode are sequentially stacked in a direction perpendicular to a plane on which the display panel is located.

For example, the display device provided by at least one embodiment of the present disclosure further comprises a controller configured to control a light transmittance of the light adjusting unit.

At least one embodiment of the present disclosure further provides a display equipment, comprising the display device provided by any one of the above embodiments.

For example, the display equipment provided by at least one embodiment of the present disclosure further comprises: a lens on a light-emitting side of the display panel. The light transmittance adjusting layer is on a side of the lens that faces the display panel, or, the light transmittance adjusting layer is on a side of the lens that is away from the display panel.

At least one embodiment of the present disclosure further provides a display method of the display device, comprising: in at least one of the plurality of pixel regions, in a first display state, controlling the light transmittance adjusting layer to have a first light transmittance, and allowing a display image through the display panel and through the light transmittance adjusting layer to have a first brightness; and in a second display state, adjusting the light transmittance adjusting layer to have a second light transmittance, and allowing the display image through the display panel and through the light transmittance adjusting layer to have a second brightness.

For example, in the display method provided by at least one embodiment of the present disclosure, the light transmittance adjusting layer comprises a plurality of light adjusting units arranged in an array, and the light adjusting unit comprises a first electrode, a second electrode, and a light adjusting layer; and voltages are applied to the first electrode and the second electrode to adjust a light transmittance of the light adjusting layer.

For example, in the display method provided by at least one embodiment of the present disclosure, the light transmittance adjusting layer comprises a plurality of light adjusting units arranged in an array, the light adjusting unit comprises a light attenuating film and a micro-electromechanical driving unit, and the light attenuating film comprises a plurality of light adjusting regions of different light transmittances; and the light attenuating film is driven to move by the micro-electro-mechanical driving unit, so as to allow the light adjusting region to be stacked with the display panel.

For example, in the display method provided by at least one embodiment of the present disclosure, the micro-electro-mechanical driving unit comprises a first rotating shaft and a second rotating shaft, and the light attenuating film is wound around the first rotating shaft and the second rotating shaft; and the first rotating shaft and the second rotating shaft are driven to rotate to allow one of the plurality of light adjusting regions to spread into a plane.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
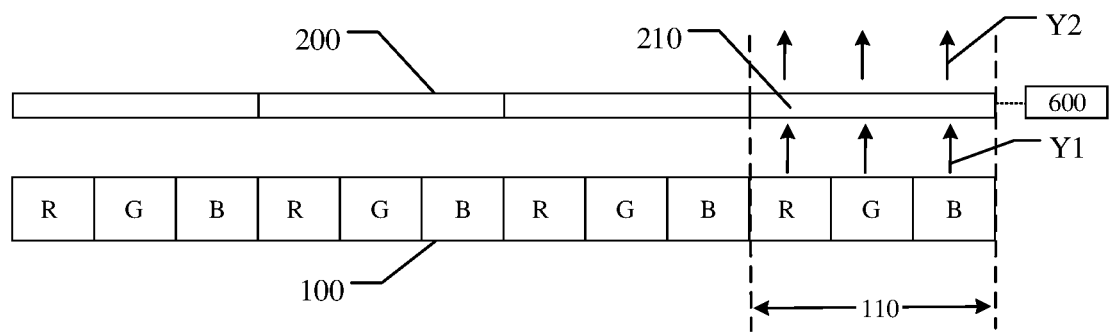
FIG. 1 is a structural schematic diagram of a display device provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least one embodiment of the present disclosure provides a display device and a display method thereof, and a display equipment. The display device comprises a display panel and a light transmittance adjusting layer, the display panel comprises a plurality of pixel regions, and the light transmittance adjusting layer is configured to adjust display brightness of the plurality of pixel regions. For example, the light transmittance adjusting layer is stacked with the display panel. In the above display device, the light transmittance adjusting layer can adjust display brightness of the pixel regions, so as to allow the gray level of each pixel region to be determined by both the display panel and the light transmittance adjusting layer, thereby even in a case where the design structure of the display panel is fixed, the gray level of the display image of the display device can be further increased, and the contrast of the display image can be further improved.

Hereinafter, the display device and the display method thereof, and the display equipment provided by at least one embodiment of the present disclosure will be described in detail with reference to the accompanying drawings.

FIG. 1 is a structural schematic diagram of a display device provided by an embodiment of the present disclosure.

For example, in at least one embodiment of the present disclosure, as illustrated in FIG. 1, the display device may include a display panel 100 and a light transmittance adjusting layer 200. The display panel 100 includes a plurality of pixel regions 110, and the light transmittance adjusting layer 200 is stacked (overlapped) with the display panel 100 (e.g., an orthographic projection of the light transmittance adjusting layer 200 on a plane on which the display panel 100 is located is within the display panel 100), and the light transmittance adjusting layer 200 is configured to adjust display brightness of the plurality of pixel regions 110. As illustrated in the figure, the light transmittance adjusting layer 200 and the display panel 100 are stacked in a normal direction (display direction) perpendicular to the display surface, and the light transmittance adjusting layer 200 is parallel to the display surface of the display panel 100. Therefore, the intensity of the light emitted from the display device is adjusted by both the display panel 100 and the light transmittance adjusting layer 200, and the increase of the display gray level of the display device is not limited by the design structure of the display panel 100 itself.

In at least one embodiment of the present disclosure, the position and the working mode of the light transmittance adjusting layer may be selected according to the type of the display panel.

For example, in the display device provided by at least one embodiment of the present disclosure, the light transmittance adjusting layer is located on a light-emitting side of the display panel. Therefore, the light transmittance adjusting layer may at least adjust the intensity of the light emitted from the display panel, so as to allow the display gray level to be increased.

For example, as illustrated in FIG. 1, the light transmittance adjusting layer 200 is located on the light-emitting side of the display panel 100, and the pixel region 110 of the display panel 100 can emit light of the brightness Y1 but cannot emit light of the brightness Y2. According to display requirements, in a display state, the light transmittance adjusting layer 200 can adjust the light of the brightness Y1 into the light of the brightness Y2; and in another display state, the brightness of the light through the light transmittance adjusting layer 200 is unchanged, alternatively, the display panel 100 is adjusted to emit light of other brightness, and the brightness of the light through the light transmittance adjusting layer 200 is Y1. Therefore, with respect to the display device, the display gray level of each pixel region 110 is increased, and the contrast of the display image can be improved. For example, the display panel 100 may be a transmission-type display panel, a reflective display panel, a transflective display panel, or the like. For example, the display panel 100 may be an organic light-emitting display panel, a liquid crystal display panel, an electronic paper display panel, or the like.

For example, in at least one embodiment of the present disclosure, the display device may further include a backlight module to provide light for display, and the backlight module is on a light-entering side of the display panel. For example, in at least one embodiment of the present disclosure, the light transmittance adjusting layer may be located between the backlight module and the display panel. The light transmittance adjusting layer may adjust the intensity of the light emitted from the backlight module, so as to control the intensity of the light emitted into each pixel region, thereby increasing the display gray level of the pixel region 110.

Figure 2:
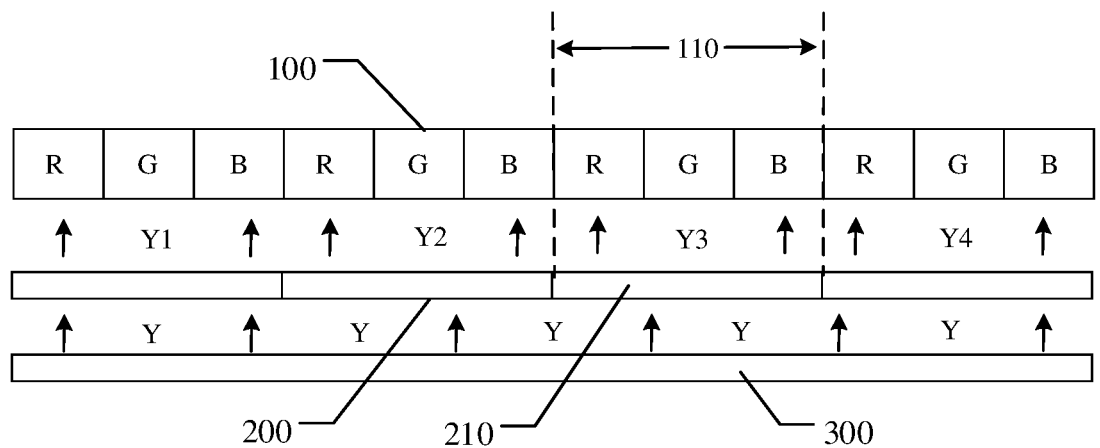
FIG. 2 is a structural schematic diagram of another display device provided by an embodiment of the present disclosure.

FIG. 2 is a structural schematic diagram of another display device provided by an embodiment of the present disclosure. For example, as illustrated in FIG. 2, the display panel 100 may be a transmission-type display panel. The light-entering side (opposite to the display side) of the display panel 100 is provided with a backlight module 300, and the backlight module 300 can emit light of uniform brightness Y. The light transmittance adjusting layer 200 is located between the display panel 100 and the backlight module 300. According to display requirements of each of the pixel regions, the light transmittance adjusting layer 200 can adjust the light of the brightness Y to the light of the brightness Y1, the light of the brightness Y2, the light of the brightness Y3, the light of the brightness Y4, or the like. Therefore, the brightness of the light emitted into each pixel region 110 of the display panel 100 may be adjusted as needed; and accordingly, the display gray level of each pixel region 110 is increased, and the contrast of the display image can be improved.

In at least one embodiment of the present disclosure, the specific structure of the backlight module is not limited as long as the backlight module can provide the display panel with the light for displaying an image. For example, the backlight module can be a direct type backlight module, a side-in type backlight module, or backlight modules of other types.

Hereinafter, the technical solution in at least one embodiment of the present disclosure will be described by taking the light transmittance adjusting layer being on the light-emitting side of the display panel as an example.

For example, in the display device provided by at least one embodiment of the present disclosure, the light transmittance adjusting layer includes a plurality of light adjusting units arranged in an array, each of the pixel regions is disposed corresponding to at least one of the light adjusting units, and the light adjusting unit is switchable to be in different light transmittances in operation. For example, an orthographic projection of at least one light adjusting unit on the plane on which the display panel is located coincides with one pixel region. Therefore, by adjusting the light transmittance of the light adjusting unit, the brightness of the light of the pixel region corresponding to the light adjusting unit can be controlled, thereby increasing the display gray level of the pixel region 110.

For example, in the display device provided by at least one embodiment of the present disclosure, the light adjusting unit is disposed in one-to-one correspondence with the pixel region. For example, an orthographic projection of one light adjusting unit on the plane on which the display panel is located completely coincides with one pixel region. Therefore, each light adjusting unit can adjust the brightness of the light emitted from one pixel region, so as to improve the precision of the adjustment and improve the display effect. For example, as illustrated in FIG. 1 and FIG. 2, the light adjusting unit 210 is disposed in one-to-one correspondence with the pixel region 110. For example, the orthographic projection of the light adjusting unit 210 on the plane on which the display panel 100 is located coincides with the corresponding pixel region 110.

For example, in the display device provided by at least one embodiment of the present disclosure, the pixel region includes at least one pixel unit, and the light adjusting unit is disposed in one-to-one correspondence with the pixel unit. Therefore, each light adjusting unit may adjust the brightness of the light emitted from one pixel unit, which may further increase the display gray level of each pixel region.

Figure 3:
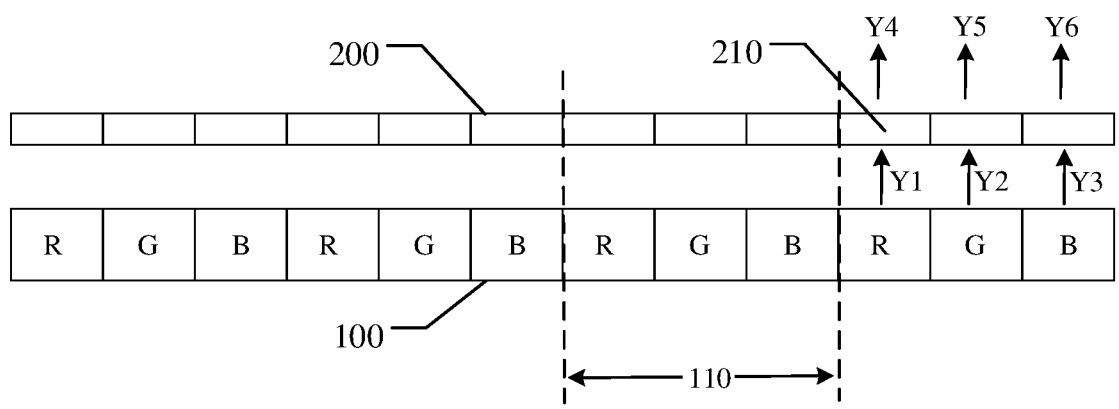
FIG. 3 is a structural schematic diagram of further another display device provided by an embodiment of the present disclosure.

FIG. 3 is a structural schematic diagram of further another display device provided by an embodiment of the present disclosure. For example, as illustrated in FIG. 3, each pixel region 110 includes a red pixel unit R, a green pixel unit G, and a blue pixel unit B, and the light adjusting unit 210 is disposed in one-to-one correspondence with each pixel unit. After the adjustment by different light adjusting units, the brightness of the light emitted from the red pixel unit R is changed from Y1 to Y4, the brightness of the light emitted from the green pixel unit G is changed from Y2 to Y5, and the brightness of the light emitted from the blue pixel unit B is changed from Y3 to Y6. The color or gray level of the image comprising the light of the brightness Y4, the light of the brightness Y5, and the light of the brightness Y6 is not independently obtained by the display panel 100, so that not only the display gray level of the pixel region 110 is increased, but also the visual effect of the display image is improved.

In the embodiment, the display device further includes a controller 600, such as a control chip, for controlling the display brightness of the pixel region of the display panel and for controlling the light transmittance of the light adjusting unit of the light transmittance adjusting layer, etc., thereby controlling the display brightness of the display panel and achieving the desired display effect. The controller, such as a central processing unit (CPU), a microcontroller, or the like, may be a special purpose processor or a general purpose processor. For example, the controller is in a signal connection with the display panel and the light transmittance adjusting layer through a signal line, and outputs corresponding control signals and output signals.

In at least one embodiment of the present disclosure, the specific structure of the light adjusting unit is not limited as long as the light adjusting unit has a function of changing the brightness of the light emitted from the pixel region.

For example, in the display device provided by at least one embodiment of the present disclosure, the light adjusting unit includes: a light attenuating film and a micro-electro-mechanical driving unit, the light attenuating film includes a plurality of light adjusting regions of different light transmittances, and the micro-electro-mechanical driving unit is configured to drive the light attenuating film to move, so as to determine the light adjusting region of the light attenuating film to be used. For example, the micro-electro-mechanical driving unit is configured to drive the light attenuating film to move, so as to allow the light adjusting region to be stacked with the display panel, and for example, the light adjusting region is stacked with the display panel in the normal direction (display direction) of the display surface and is parallel to the display surface. During the display process, the micro-electro-mechanical driving unit may drive the light attenuating film to move, so as to allow the light adjusting region of the corresponding transmittance to correspond to the pixel region. In this case, the controller can be used to control the micro-electro-mechanical driving unit whether to drive the light attenuating film. For example, the controller may be in a signal connection with the micro-electro-mechanical driving unit in a wired or wireless manner, so as to realize the control of the micro-electro-mechanical driving unit. In at least one embodiment of the present disclosure, the driving type of the micro-electro-mechanical driving unit is not limited. For example, the driving mode of the micro-electro-mechanical driving unit may be a rotating (or twisting) driving mode or a linear (or oscillating) driving mode. For example, the micro-electro-mechanical driving unit can be realized by a MEMS preparation process, and details are not described herein again.

Hereinafter, the technical solution of at least one embodiment of the present disclosure will be described by taking the driving mode of the micro-electro-mechanical driving unit being the rotating driving as an example.

For example, in the display device provided by at least one embodiment of the present disclosure, the micro-electro-mechanical driving unit includes a first rotating shaft and a second rotating shaft, the light attenuating film is wound around the first rotating shaft and the second rotating shaft, and the first rotating shaft and the second rotating shaft are rotated to allow one of the plurality of light adjusting regions to spread into a plane. By driving the first rotating shaft and the second rotating shaft to rotate, the light attenuating film is moved to allow the light adjusting regions of different transmittances to correspond to the pixel regions. The arrangement of the light attenuating film being wound around the first rotating shaft and the second rotating shaft may reduce the size of the micro-electro-mechanical driving unit, and the driving mode is simple, which simplifies the structure of the micro-electro-mechanical driving unit.

Figure 4A:
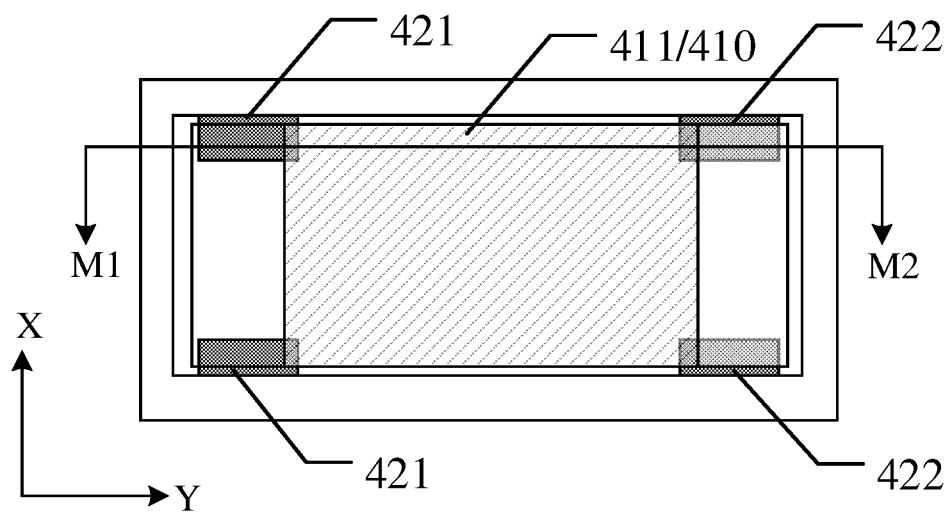
FIG. 4A to FIG. 4D are structural schematic diagrams of a light adjusting unit of the display device provided by an embodiment of the present disclosure.
Figure 4B:
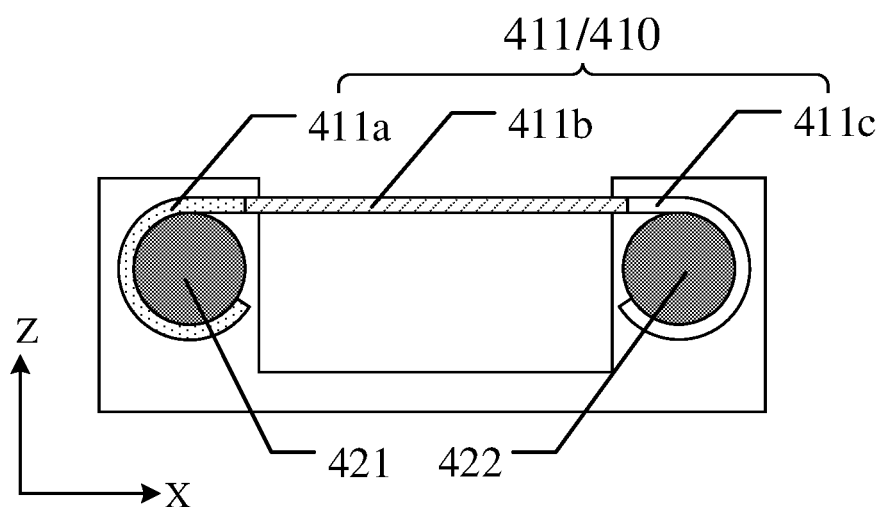
Figure 4C:
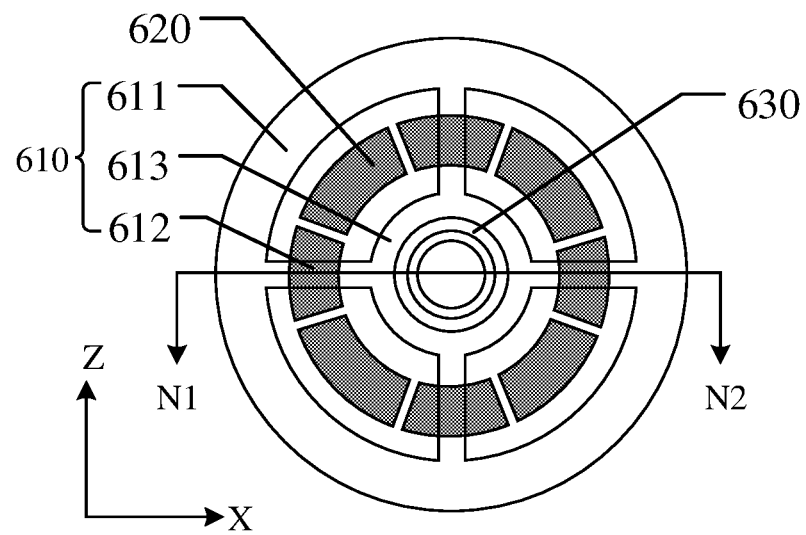
Figure 4D:
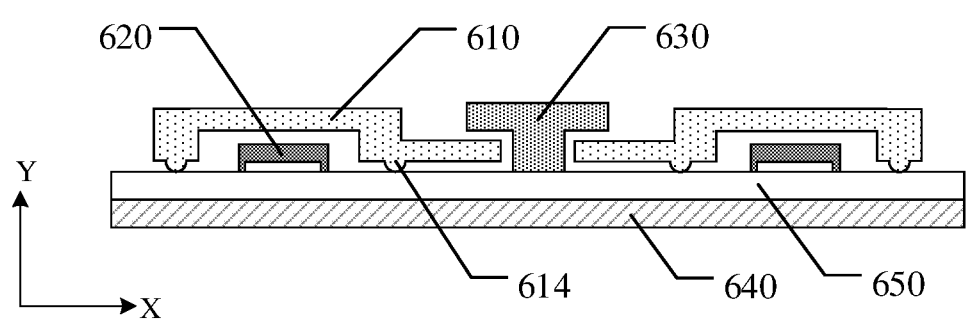

FIG. 4A to FIG. 4D are structural schematic diagrams of a light adjusting unit of a display device provided by an embodiment of the present disclosure. FIG. 4A is a structural schematic diagram of a micro-electro-mechanical driving unit, FIG. 4B is a cross-sectional diagram of the micro-electro-mechanical driving unit in FIG. 4A along M1~M2, FIG. 4C is a planar structure schematic diagram of the rotating shaft in FIG. 4B, and FIG. 4D is a cross-sectional diagram of the rotating shaft in FIG. 4C along N1~N2.

For example, in at least one embodiment of the present disclosure, as illustrated in FIG. 4A and FIG. 4B, the light attenuating film 410 is wound around the first rotating shaft 421 and the second rotating shaft 422, and the light attenuating film 410 includes a plurality of light adjusting regions 411, such as a first light adjusting region 411*a*, a second light adjusting region 411*b*, and a third light adjusting region 411*c*. For example, the light transmittances of the first light adjusting region 411*a*, the second light adjusting region 411*b*, and the third light adjusting region 411*c* are sequentially decreased. Thus, driving the first rotating shaft 421 and the second rotating shaft 422 to rotate can allow the specific light adjusting region 411 to correspond to the pixel region. For example, the light transmittance of one light adjusting region (for example, the first light adjusting region 411*a*) in the light attenuating film 410 is about 100%, so as to allow the brightness of the light through the light adjusting region to be unchanged. For example, a portion, corresponding to the pixel region (or pixel unit), of the first light adjusting region 411*a* is hollowed out, so as to allow the light transmittance of the first light adjusting region 411*a* to be 100%.

For example, in the display device provided by at least one embodiment of the present disclosure, an orthographic projection of the pixel region on the display panel coincides with an orthographic projection of the light adjusting region on the display panel, alternatively, the orthographic projection of the pixel region on the display panel is within the orthographic projection of the light adjusting region on the display panel. Therefore, the light adjusting unit can adjust the brightness of all the light emitted from the entire pixel region, thereby improving the display effect of the display device.

For example, in the display device provided by at least one embodiment of the present disclosure, an orthographic projection of the pixel unit on the display panel coincides with the orthographic projection of the light adjusting region on the display panel, alternatively, the orthographic projection of the pixel unit on the display panel is within the orthographic projection of the light adjusting region on the display panel. Therefore, the light adjusting unit can adjust the brightness of all the light emitted from each pixel unit, thereby improving the display effect of the display device.

In at least one embodiment of the present disclosure, the specific structures of the rotating shafts (the first rotating shaft 421 and the second rotating shaft 422) are not limited, as long as the rotating shafts can provide a sufficiently large torque (for example, a dynamic torque). For example, the rotating shaft may be an electrostatic micro-motor, an electromagnetic micro-motor, a piezoelectric micro-motor, or the like. Hereinafter, the technical solution of at least one embodiment of the present disclosure will be described by taking the rotating shaft being the electrostatic micro-motor as an example. For example, each rotating shaft may include two electrostatic micro-motors, and the two electrostatic micro-motors may stretch the light attenuating film, so that the first rotating shaft 421 and the second rotating shaft 422 may allow at least a portion (for example, one light adjusting region) of the light attenuating film to be stretched into a plane.

For example, as illustrated in FIG. 4C and FIG. 4D, the rotating shaft (the first rotating shaft 521 or the second rotating shaft 422) is an electrostatic micro-motor, the electrostatic micro-motor includes a rotor 610 and a plurality of stators 620, and the rotor 610 and the stator 620 are spaced apart from each other. In a case where a bias voltage is applied to the stator 620, an electric field is generated between the corresponding rotor 610 and the stator 620, and electrostatic attraction is generated between the corresponding rotor 610 and the stator 620, thereby allowing the rotor 610 and the stator 620 to be aligned and allowing the rotor 610 to keep rotating by continuously energizing the stator 620 (applying a bias voltage to the stator 620) in groups.

For example, in at least one embodiment of the present disclosure, as illustrated in FIG. 4C and FIG. 4D, the electrostatic micro-motor may further include a flange 630 and a substrate 640. The rotor 610 and the flange 630 are fixed on the substrate 640, and the flange 630 is used for limiting the position of the rotor 610 to prevent the rotor 610 from falling off. For example, the substrate 640 may be a silicon wafer. For example, materials of the rotor 610 and the stator 620 may include a conductive material such as polysilicon or the like.

For example, in at least one embodiment of the present disclosure, as illustrated in FIG. 4C and FIG. 4D, the electrostatic micro-motor may further include an insulating layer 650. For example, in a case where the material of the substrate 640 includes silicon, the insulating layer 650 may prevent the rotor 610 and the stator 620 from being electrically connected through the substrate 640.

For example, in at least one embodiment of the present disclosure, as illustrated in FIG. 4C and FIG. 4D, the rotor 610 includes a first portion 611, a second portion 612, and a third portion 613, the second portion 612 is disposed in plurality, and the first portion 611 and the third portion 613 is connected by the second portion 612. The flange 630 limits the position of the third portion 613, so that the rotor 610 may not fall off. For example, the third portion 613 is located between the flange 630 and the substrate 640, the flange 630 is connected to the substrate 640 (or the insulating layer 650), and the inner edge of the third portion 613 is located within the outer edge of the flange 630. For example, the space between the second portion 612 and the stator 620 is relatively small, so that in a case where an electric field is generated between the rotor 610 and the stator 620, electric charges in the rotor 610 are primarily concentrated at the second portion 612. Therefore, different second portions 612 are allowed to generate static electricity by the stator 620, and the rotor 610 can be driven to rotate.

For example, in at least one embodiment of the present disclosure, as illustrated in FIG. 4C and FIG. 4D, the stator 620 is located between the second portion 612 and the substrate 640. Therefore, during the using process, the electrostatic force between the stator 620 and the rotor 610 allows the rotor 610 to be fixed on the substrate 640, thereby preventing the rotor 610 from falling off.

For example, in at least one embodiment of the present disclosure, as illustrated in FIG. 4C and FIG. 4D, the first portion 611 is located on a side, away from the flange 630, of the stator 620, and the outer edge of the first portion 611 may be in a circular shape. Therefore, the light attenuating film can be fixed on the rotor 610. Further, for example, the light attenuating film is fixed on the outer edge of the rotor 610. Thus, the rotor 610 can drive the light attenuating film to move, and the light attenuating film can be wound around the outer edge of the first portion 611.

For example, in at least one embodiment of the present disclosure, as illustrated in FIG. 4C and FIG. 4D, protrusions 614 may be disposed on a side, facing the substrate 640, of the first portion 611 and the third portion 613. Where the rotor 610 moves, the protrusions 614 may reduce the friction of the first portion 611 on the substrate 640 and the friction of the third portion 613 on the substrate 640.

It should be noted that, in at least one embodiment of the present disclosure, the first portion 611 may increase the stability of the structure of the rotor 610, and the rotor 610 may also be configured to include only the second portion 612 and the third portion 613. For example, the light attenuating film may be fixed on the second portion 612.

In at least one embodiment of the present disclosure, the size of the rotating shaft (electrostatic micro-motor) is not limited. For example, the size of the electrostatic micro-motor may be no greater than 150 microns, such as no greater than 100 microns.

In at least one embodiment of the present disclosure, the thickness and material of the light attenuating film are not limited. For example, the thickness of the light attenuating film may be no greater than 50 microns. The material of the light attenuating film may be a flexible material, such as polymethyl methacrylate, polyethylene terephthalate, polyimide or other materials. For another example, the light adjusting regions of different transmittances of the light attenuating film can be realized by a rubbing process.

FIG. 5A to FIG. 5E are flowcharts of a method of manufacturing rotating shafts in the light adjusting unit illustrated in FIGS. 4C and 4D. Hereinafter, a method of manufacturing an electrostatic micro-motor of a display device provided by at least one embodiment of the present disclosure will be described by taking the manufacture of the rotating shaft (electrostatic micro-motor) illustrated in FIG. 4C and FIG. 4D as an example.

Figure 5A:
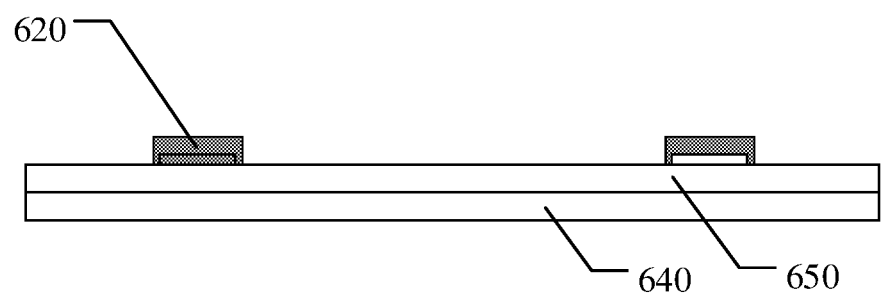
FIG. 5A to FIG. 5E are flowcharts of a method of manufacturing rotating shafts in the light adjusting unit illustrated in FIG. 4C and FIG. 4D.

As illustrated in FIG. 5A, the substrate 640 is provided, and a polysilicon material is deposited on the substrate 640 and is patterned to form the stator 620.

It should be noted that materials of the substrate 640 and the stator 620 are not limited, as long as the substrate 640 can be used to manufacture an electrostatic micro-motor that meets the size requirements, and the stator 620 has a certain electrical conductivity.

For example, in at least one embodiment of the present disclosure, the patterning process may be a photolithographic patterning process. For example, the photolithographic patterning process may include: coating a photoresist layer on the structure layer to be patterned, using a mask to expose the photoresist layer, developing the exposed photoresist layer to obtain a photoresist pattern, using the photoresist pattern to etch the structure layer, and then optionally removing the photoresist pattern. It should be noted that if the patterned structure layer includes a photoresist material, the photoresist coating process may not be required.

For example, as illustrated in FIG. 5A, prior to forming the stator 620, an insulating material may be deposited on the substrate 640 to form the insulating layer 650. The material of the insulating layer 650 may include materials such as silicon dioxide, silicon nitride, silicon oxynitride, or the like, and the insulating layer 650 may have a single layer structure or may have a multi-layer structure. The above materials can perform the function of insulating, and can further improve the adhesion of other structures (for example, the stator 620, the flange 630, etc.), formed in the subsequent process, on the substrate 640.

Figure 5B:
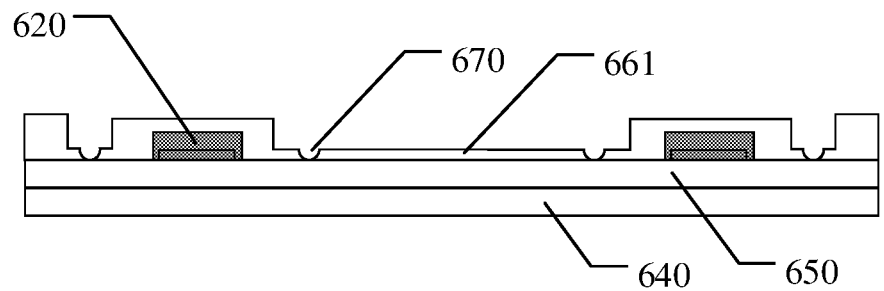

As illustrated in FIG. 5B, a thin film of insulating material is deposited on the substrate 640 and is patterned to form a first sacrificial layer 661. For example, a plurality of hollows 670 may be formed in the first sacrificial layer 661, and the shape and position of the hollow may correspond to the protrusion 614 illustrated in FIG. 4D.

For example, the material of the first sacrificial layer 661 may include phosphorus doped silicon dioxide (PSG), boron doped phosphorus silicon dioxide (BPSG), or other materials.

Figure 5C:
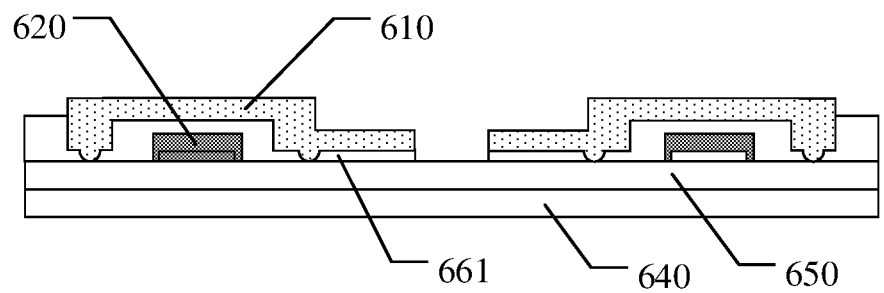

As illustrated in FIG. 5C, a thin film of conductive material (e.g., polysilicon) is deposited on the substrate 640 and is patterned to form the rotor 610. The central location of the rotor 610 is disposed to expose the substrate 640 (or to expose the insulating layer 650), and the central location corresponds to the flange 630 formed in the subsequent process.

Figure 5D:
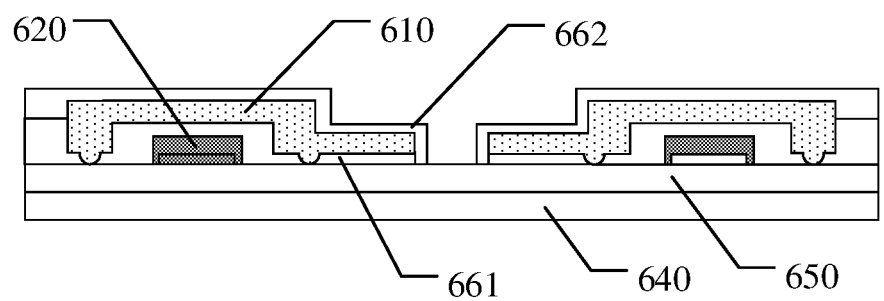

As illustrated in FIG. 5D, a thin film of insulating material is deposited on the substrate 640 and is patterned to form a second sacrificial layer 662. At the design location of the flange 630 in the subsequent process, the second sacrificial layer 662 is disposed to expose the substrate 640 (or to expose the insulating layer 650). For example, the material of the second sacrificial layer 662 may include phosphorus doped silicon dioxide (PSG), boron doped phosphorus silicon dioxide (BPSG), or other materials.

Figure 5E:
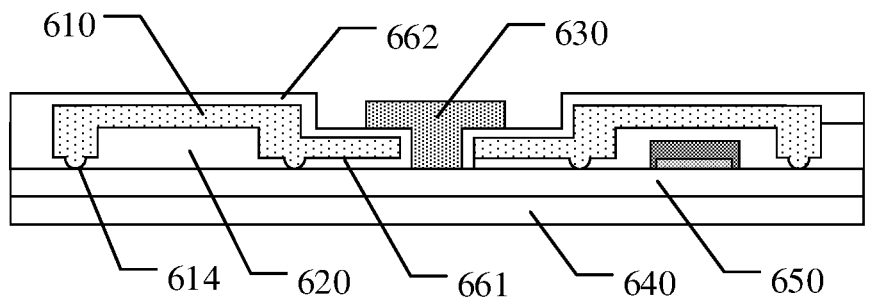

As illustrated in FIG. 5E, the flange 630 is formed on the second sacrificial layer 662, and the flange 630 is in contact with the substrate 640 or the insulating layer 650. For example, the size of the flange 630 can be set by a patterning process. For example, in at least one embodiment of the present disclosure, the material of the flange 630 is not limited as long as the flange 630 has a good connection force with the insulating layer 650 or the substrate 640. For example, the material of the flange 630 may include polysilicon, silicon oxide, silicon nitride, silicon oxynitride, or the like.

Thereafter, for example, by a chemical dissolution method, the first sacrificial layer 661 and the second sacrificial layer 662 are removed to obtain the structure as illustrated in FIG. 4D.

Figure 6:
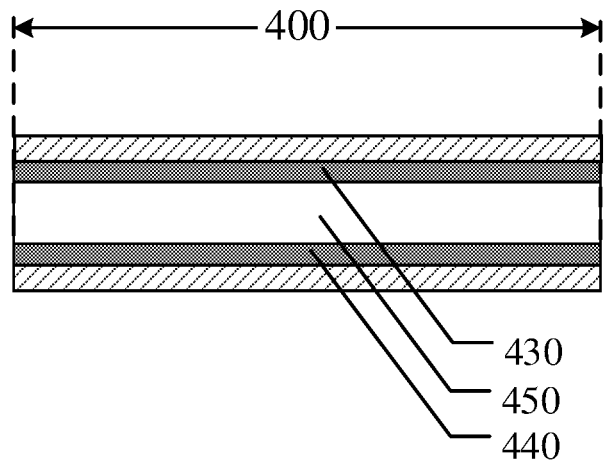
FIG. 6 is a structural schematic diagram of another light adjusting unit of the display device provided by an embodiment of the present disclosure.

For example, in the display device provided by at least one embodiment of the present disclosure, the light adjusting unit comprises: a first electrode, a second electrode, and a light adjusting layer. The first electrode and the second electrode are configured to be applied with voltages to adjust a light transmittance of the light adjusting layer. Therefore, the controller can be used to control the magnitude of the voltages applied to the first electrode and the second electrode, so as to control the light transmittance of the light adjusting layer. FIG. 6 is a structural schematic diagram of another light adjusting unit of a display device provided by an embodiment of the present disclosure. For example, as illustrated in FIG. 6, the light adjusting unit 400 includes a first electrode 430, a second electrode 440, and a light adjusting layer 450. After the first electrode 430 and the second electrode 440 are applied with voltages, an electric field can be generated, and the light transmittance of the light adjusting layer 450 is controlled by the electric field, so that the light transmittance of the light adjusting unit 400 can be adjusted.

For example, in at least one embodiment of the present disclosure, the first electrode and the second electrode may be transparent electrodes or translucent electrodes. For example, the material of the transparent electrode may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, or the like.

In at least one embodiment of the present disclosure, the specific structure of the light adjusting layer is not limited as long as the light transmittance of the light adjusting layer can be controlled by the electric field.

For example, in the display device provided by at least one embodiment of the present disclosure, the light adjusting layer is an electrochromic layer, the electrochromic layer is between the first electrode and the second electrode, and the first electrode, the electrochromic layer and the second electrode are sequentially stacked in a direction perpendicular to a plane on which the display panel is located. For example, as illustrated in FIG. 6, the light adjusting layer 450 is an electrochromic layer, and the first electrode 430, the electrochromic layer 450, and the second electrode 440 are sequentially stacked in a direction perpendicular to a plane on which the display panel 100 is located. The electrochromic layer 450 includes an electrochromic material, and the light transmittance of the electrochromic material can be changed under the action of the electric field, for example, the electrochromic material can be changed from a transparent state to a dark state. For example, in a case where the first electrode 430 and the second electrode 440 are not applied with voltages or are applied with equal voltages, the potential difference between the first electrode 430 and the second electrode 440 is zero, and the electrochromic layer 450 is in the transparent state; and in a case where the potential difference between the first electrode 430 and the second electrode 440 is greater than zero, the electrochromic layer 450 is in the dark state, and the light transmittance of the electrochromic layer 450 gradually decreases as the potential difference increases. For example, the magnitude of the voltages applied to the first electrode 430 and the second electrode 440 can be controlled by the controller, so that the color of the electrochromic layer 450 can be changed to adjust the light transmittance of the electrochromic layer 450.

In at least one embodiment of the present disclosure, the type of electrochromic material in the electrochromic layer is not limited. For example, the electrochromic material may include tungsten trioxide, polythiophenes and derivatives thereof, viologens, tetrathiafulvalenes, metal phthalocyanines, or the like.

For example, in the display device provided by at least one embodiment of the present disclosure, the light adjusting layer is an electronic ink layer, the electronic ink layer is between the first electrode and the second electrode, and the first electrode, the electronic ink layer and the second electrode are sequentially stacked in a direction perpendicular to a plane on which the display panel is located. For example, as illustrated in FIG. 6, the light adjusting layer 450 is an electronic ink layer. For example, a polar light shielding material or an electric light shielding material may be disposed in the electronic ink layer 450, and the electric field generated between the first electrode 430 and the second electrode 440 controls the transfer or inversion of the light shielding material, so as to allow the electronic ink layer to have different light transmittances. For example, the magnitude of the voltages applied to the first electrode 430 and the second electrode 440 may be controlled by the controller, so as to change the light transmittance of the electronic ink layer.

Figure 7:
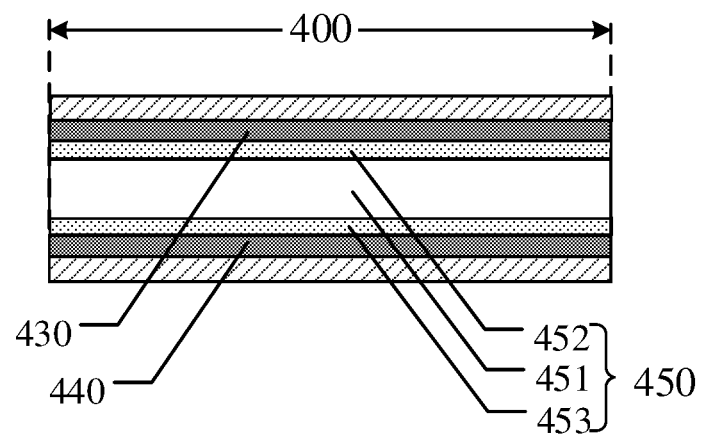
FIG. 7 is a structural schematic diagram of further another light adjusting unit of the display device provided by an embodiment of the present disclosure.

For example, in the display device provided by at least one embodiment of the present disclosure, the light adjusting layer includes a liquid crystal layer, and a first polarizing layer and a second polarizing layer respectively on two sides of the liquid crystal layer. The first electrode and the second electrode are on a same side or different sides of the liquid crystal layer, and the first electrode and the second electrode are applied with voltages to adjust the light transmittance of the light adjusting layer. FIG. 7 is a structural schematic diagram of further another light adjusting unit of a display device provided by an embodiment of the present disclosure. For example, as illustrated in FIG. 7, the light adjusting layer 450 includes a liquid crystal layer 451, and a first polarizing layer 452 and a second polarizing layer 453 respectively located on two sides of the liquid crystal layer 451. The liquid crystal layer 451 includes liquid crystal molecules, and the electric field generated by the first electrode 430 and the second electrode 440 controls the rotation of the liquid crystal molecules. Under the cooperation of the first polarizing layer 452 and the second polarizing layer 453, the light transmittance of the light adjusting layer 450 can be changed. For example, the magnitude of the voltages applied to the first electrode 430 and the second electrode 440 may be controlled by the controller, so as to change the rotation degree of the liquid crystal molecules in the liquid crystal layer 451, thereby changing the light transmittance of the liquid crystal layer 451.

At least one embodiment of the present disclosure provides a display equipment, which includes the display device provided by any one of the above embodiments. For example, the display equipment comprises the controller 600 for controlling the display brightness of the pixel region of the display panel and for controlling the light transmittance of the light adjusting unit of the light transmittance adjusting layer. For example, in a case where the display brightness of a pixel region of the display panel does not satisfy the requirements of a display image, the controller can control the light transmittance of the light adjusting unit corresponding to the pixel region to a certain degree to adjust the display brightness of the pixel region to meet the requirements. For example, in a case where the display brightness of a pixel region of the display panel satisfies the requirements of a display image, the light adjusting unit corresponding to the pixel region may not be adjusted by the controller 600. The display equipment may be any product or component having a display function, such as a tablet computer, a television, a display, a notebook computer, a digital photo frame, a navigator, etc., which is not limited by at least one embodiment of the present disclosure.

For example, in at least one embodiment of the present disclosure, the display equipment can be applied to a two-dimensional display or three-dimensional display field. For example, the display equipment can be applied to the fields of virtual reality (VR), augmented reality (AR), mixed reality (MR), or the like.

Figure 8:
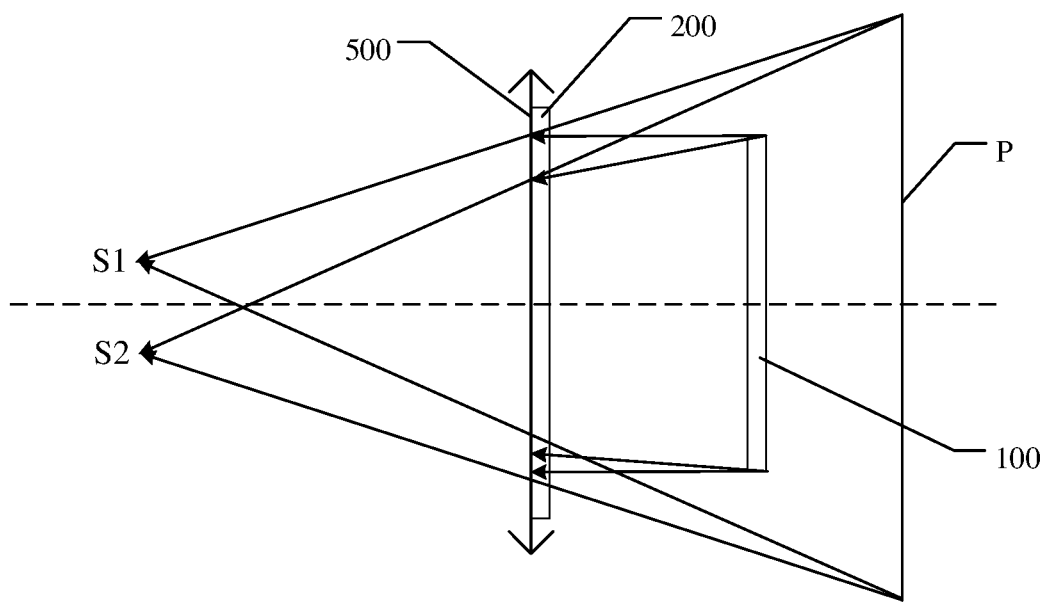
FIG. 8 is a structural schematic diagram of a display equipment provided by an embodiment of the present disclosure.

For example, the display equipment provided by at least one embodiment of the present disclosure further includes a lens, and the lens is located on a light-emitting side of the display panel. FIG. 8 is a structural schematic diagram of a display equipment provided by an embodiment of the present disclosure. For example, as illustrated in FIG. 8, the display panel 100 can generate a parallax image, and the parallax image through the lens 500 enters the left and right eyes (positions S1 and S2) of the user respectively. The lens 500 can form a virtual image P, the size of the virtual image P is greater than the size of the display panel 100, and the distance between the virtual image P and the user's eyes is greater than the distance between the display panel 100 and the user's eyes. Therefore, the lens 500 can increase the viewing angle and imaging distance of the display image of the display equipment, and can allow the design space between the display panel 100 and the user's eyes to be reduced, which is advantageous to the miniaturization of the display equipment.

For example, in at least one embodiment of the present disclosure, as illustrated in FIG. 8, the light transmittance adjusting layer 200 may be disposed on the lens 500. For example, the light transmittance adjusting layer 200 may be located on a side, facing the display panel 100, of the lens 500, alternatively, the light transmittance adjusting layer 200 may be located on a side, away from the display panel 100, of the lens 500.

For example, in at least one embodiment of the present disclosure, the type of display panel in the display equipment is not limited. For example, in some embodiments of the present disclosure, the display panel can be configured to provide the parallax image. For example, in other embodiments of the present disclosure, at least two display panels may be disposed in the display equipment, and display images generated by the at least two display panels are respectively into the left and right eyes of the user, so that the display equipment can also realize a 3D display function.

At least one embodiment of the present disclosure further provides a display method of any one of the above display devices, and the method includes: in at least one of the pixel regions, in a first display state, controlling the light transmittance adjusting layer to have a first light transmittance, and allowing a display image through the display panel and through the light transmittance adjusting layer to have a first brightness; and in a second display state, adjusting the light transmittance adjusting layer to have a second light transmittance, and allowing the display image through the display panel and through the light transmittance adjusting layer to have a second brightness. In the above display method, the light transmittance adjusting layer can adjust the display brightness of the pixel region, so as to allow the gray level of each pixel region to be determined by both the display panel and the light transmittance adjusting layer. In a case where the design structure of the display panel is fixed, the gray level of the display image of the display device can be further increased, and the contrast of the display image can be improved. It should be noted that the specific structure of the display device in the above display method may refer to the related content in the embodiments described above, and at least one embodiment of the present disclosure is not limited in this aspect.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or area may be enlarged or narrowed, that is, the drawings are not drawn in a real scale.

(3) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A display device, comprising:
a display panel, comprising a plurality of pixel regions; and
a light transmittance adjusting layer stacked with the display panel, wherein the light transmittance adjusting layer is configured to adjust display brightness of the plurality of pixel regions;
the light transmittance adjusting layer comprises a plurality of light adjusting units arranged in an array, each of the plurality of pixel regions is disposed corresponding to at least one of the plurality of light adjusting units, and
the at least one of the plurality of light adjusting units is switchable to be in different light transmittances in operation;
each of the plurality of light adjusting units comprises:
a light attenuating film, comprising a plurality of light adjusting regions of different light transmittances; and
a micro-electro-mechanical driving unit configured to drive the light attenuating film to move, so as to allow at least one of the plurality of light adjusting regions to be stacked with the display panel.

2. The display device according to claim 1, wherein the light transmittance adjusting layer is on a light-emitting side of the display panel.

3. The display device according to claim 1, further comprising:
a backlight module on a light-entering side of the display panel,
wherein the light transmittance adjusting layer is between the backlight module and the display panel.

4. The display device according to claim 1, wherein each of the plurality of pixel regions comprises at least one pixel unit; and
the plurality of light adjusting units are disposed in one-to-one correspondence with the plurality of pixel regions, alternatively, the plurality of light adjusting units are disposed in one-to-one correspondence with the at least one pixel unit.

5. The display device according to claim 1, wherein the micro-electro-mechanical driving unit comprises a first rotating shaft and a second rotating shaft, the light attenuating film is wound around the first rotating shaft and the second rotating shaft, and
the first rotating shaft and the second rotating shaft are rotated to allow one of the plurality of light adjusting regions to spread into a plane.

6. The display device according to claim 5, wherein the first rotating shaft and the second rotating shaft are both electrostatic micro-motors; and
the electrostatic micro-motor comprises a rotor and a stator which are spaced apart from each other, and the rotor is rotatable relative to the stator under driving of a voltage.

7. The display device according to claim 5, wherein an orthographic projection of the pixel region on the display panel coincides with an orthographic projection of the light adjusting region on the display panel.

8. The display device according to claim 5, wherein an orthographic projection of the pixel region on the display panel is within an orthographic projection of the light adjusting region on the display panel.

9. The display device according to claim 1, wherein each of the plurality of light adjusting units comprises: a first electrode, a second electrode, and a light adjusting layer,
wherein the first electrode and the second electrode are applied with voltages to adjust a light transmittance of the light adjusting layer.

10. The display device according to claim 9, wherein the light adjusting layer comprises a liquid crystal layer, and a first polarizing layer and a second polarizing layer respectively on two sides of the liquid crystal layer; and
the first electrode and the second electrode are on a same side or different sides of the liquid crystal layer, and the first electrode and the second electrode are applied with the voltages to adjust the light transmittance of the light adjusting layer.

11. The display device according to claim 9, wherein the light adjusting layer is an electrochromic layer, the electrochromic layer is between the first electrode and the second electrode, and
the first electrode, the electrochromic layer and the second electrode are sequentially stacked in a direction perpendicular to a plane on which the display panel is located.

12. The display device according to claim 1, further comprising a controller configured to control a light transmittance of the light adjusting unit.

13. A display equipment, comprising the display device according to claim 1.

14. The display equipment according to claim 13, further comprising: a lens on a light-emitting side of the display panel,
wherein the light transmittance adjusting layer is on a side of the lens that faces the display panel.

15. The display equipment according to claim 13, further comprising: a lens on a light-emitting side of the display panel,
wherein the light transmittance adjusting layer is on a side of the lens that is away from the display panel.

16. A display device, comprising:
a display panel, comprising a plurality of pixel regions; and
a light transmittance adjusting layer stacked with the display panel, wherein the light transmittance adjusting layer is configured to adjust display brightness of the plurality of pixel regions;
the light transmittance adjusting layer comprises a plurality of light adjusting units arranged in an array, each of the plurality of pixel regions is disposed corresponding to at least one of the plurality of light adjusting units, and the at least one of the plurality of light adjusting units is switchable to be in different light transmittances in operation;

each of the plurality of light adjusting units comprises: a first electrode, a second electrode, and a light adjusting layer, wherein the first electrode and the second electrode are applied with voltages to adjust a light transmittance of the light adjusting layer;

the light adjusting layer is an electronic ink layer, the electronic ink layer is between the first electrode and the second electrode, and the first electrode, the electronic ink layer and the second electrode are sequentially stacked in a direction perpendicular to a plane on which the display panel is located.

* * * * *

UNITED STATES PATENT AND TRADEMARK OFFICE
CERTIFICATE OF CORRECTION

| | |
|---|---|
| PATENT NO. | : 11,335,283 B2 |
| APPLICATION NO. | : 16/483541 |
| DATED | : May 17, 2022 |
| INVENTOR(S) | : Chenru Wang et al. |

It is certified that error appears in the above-identified patent and that said Letters Patent is hereby corrected as shown below:

On the Title Page

Item (54) and in the Specification, Column 1, Line 1 the Title, should be:
--DISPLAY DEVICE WITH LIGHT TRANSMITTANCE ADJUSTING LAYER AND DISPLAY METHOD THEREOF, DISPLAY EQUIPMENT--.

Signed and Sealed this
Thirtieth Day of May, 2023

Katherine Kelly Vidal
*Director of the United States Patent and Trademark Office*